US012808531B2

(12) United States Patent
Rasmussen

(10) Patent No.: US 12,808,531 B2
(45) Date of Patent: Nov. 24, 2026

(54) LIGHT FIXTURE WITH ADJUSTABLE LENS AND LIQUID ACCUMULATION DETECTION

(71) Applicant: HARMAN PROFESSIONAL DENMARK APS, Aarhus N (DK)

(72) Inventor: Niels Jørgen Rasmussen, Egaa (DK)

(73) Assignee: HARMAN PROFESSIONAL DENMARK APS, Aarhus N (DK)

( * ) Notice: Subject to any disclaimer, the term of this patent is extended or adjusted under 35 U.S.C. 154(b) by 0 days.

(21) Appl. No.: 19/187,132

(22) Filed: Apr. 23, 2025

(65) Prior Publication Data

US 2025/0354684 A1 Nov. 20, 2025

(30) Foreign Application Priority Data

May 14, 2024 (EP) .................................... 24175753

(51) Int. Cl.

| | |
|---|---|
| ***F21V 21/30*** | (2006.01) |
| ***F21V 14/06*** | (2006.01) |
| ***F21V 31/00*** | (2006.01) |
| ***G01B 7/30*** | (2006.01) |
| ***G01R 19/165*** | (2006.01) |
| ***H02K 37/24*** | (2006.01) |
| *F21W 131/10* | (2006.01) |

(52) U.S. Cl.

CPC ............ *F21V 31/005* (2013.01); *F21V 14/06* (2013.01); *F21V 21/30* (2013.01); *G01B 7/30* (2013.01); *G01R 19/16533* (2013.01); *H02K 37/24* (2013.01); *F21W 2131/10* (2013.01)

(58) Field of Classification Search

CPC .......... F21V 21/15; F21V 21/30; F21V 14/06; F21V 17/02; F21V 23/0442; F21W 2131/10

See application file for complete search history.

(56) References Cited

U.S. PATENT DOCUMENTS 1,876,511 A * 9/1932 Oberg ........................ F21V 9/08 362/277
3,116,022 A * 12/1963 Davis .................... F21V 29/763 362/268
5,590,955 A * 1/1997 Bornhorst ............... F21V 17/02 362/232
5,816,690 A * 10/1998 Romano ................. F21V 21/15 362/268

(Continued)

FOREIGN PATENT DOCUMENTS

CN 204785705 U 11/2015
CN 109519892 B 2/2021

(Continued)

*Primary Examiner* — Ismael Negron

(74) *Attorney, Agent, or Firm* — Artegis Law Group, LLP

(57) ABSTRACT

The light fixture includes a compartment housing at least one light source configured to emit light in a main light emission direction. A lens is provided movably arranged relative to the light source in direction of the main light emission direction, and an electric motor configured to move the lens relative to the light source in direction of the main light emission direction. A control unit determines a current used by the electric motor to move the lens in the main light emission direction, wherein the control unit is configured to detect a presence of a liquid on the lens based on the determined current.

13 Claims, 5 Drawing Sheets

(56) References Cited

U.S. PATENT DOCUMENTS

| | | | | | |
|---|---|---|---|---|---|
| 5,980,066 | A * | 11/1999 | Belliveau | F21V 14/06 362/323 |
| 6,113,252 | A * | 9/2000 | Arlitt | F21S 10/007 362/322 |
| 6,744,693 | B2 * | 6/2004 | Brockmann | F21V 29/773 362/322 |
| 6,817,737 | B2 * | 11/2004 | Romano | F21V 29/767 362/268 |
| 10,234,105 | B2 * | 3/2019 | Jurik | F21V 5/045 |
| 10,760,766 | B2 * | 9/2020 | Matsuoka | F21V 29/67 |
| 11,060,700 | B2 * | 7/2021 | Jiang | F21V 14/06 |
| 12,163,656 | B2 * | 12/2024 | Alfier | F21V 14/06 |
| 12,181,144 | B2 * | 12/2024 | Jurik | F21V 17/06 |
| 2020/0052626 | A1 | 2/2020 | Vavrik et al. | |
| 2024/0093863 | A1 | 3/2024 | Rasmussen | |

FOREIGN PATENT DOCUMENTS

| | | | |
|---|---|---|---|
| CN | 214580650 | U | 11/2021 |
| CN | 116928650 | A | 10/2023 |
| CN | 114033978 | B | 2/2024 |

* cited by examiner

LIGHT FIXTURE WITH ADJUSTABLE LENS AND LIQUID ACCUMULATION DETECTION

CROSS-REFERENCE TO RELATED APPLICATIONS

This application claims priority benefit of Application No. EP 24175753.3, titled "LIGHT FIXTURE WITH LIQUID DETECTION," and filed May 14, 2024. The subject matter of this related application is hereby incorporated by reference herein in its entirety.

DETAILED DESCRIPTION

Technical Field

The application relates generally to light fixtures and more specifically to techniques for protecting light fixtures from moisture or liquid.

BACKGROUND

In many industrial lighting applications ingress protection is applied to improve robustness against water and particles, such as dust. Normally this causes increased costs and/or complexity, lower serviceability etc. When the protection is applied to joints between elements arranged for mutual movement, the solution often includes special sealings and hydrophobic grease where the drawback is higher friction and noise, and/or alternatively lower lighting quality.

In entertainment and architectural lighting, light fixtures, such as moving head light fixtures, are often used outdoor with the risk of rain showers and/or other sources of moisture. Therefore, the product should either be placed safely under a roof, or it should be ingress protected with IP class 44 or higher. An important section of a moving head light fixture is the movement of the lens relative to the light source(s) arranged in the head. Traditionally an extra window is arranged in front of the lens at a distance to allow movement of the lens relative to the light source(s) without collision with the window. The window can protect the lens and decrease the risk of moisture ingress into the head. However, the window may cause internal reflections, and fingerprints on the window may change the output light. The window itself may additionally decrease the output from the light source(s) and may add weight to the moving head light fixture. Accordingly, a need exists to overcome the problems mentioned above and to provide a light fixture with a high light output with minimum internal reflections even when used outdoor in an environment where the light fixture is exposed to rain or where other objects could be present on the lens which is not protected by a closing window.

SUMMARY

This need is met by the features of the independent claim. Further aspects are described in the dependent claims.

According to one aspect a light fixture is provided comprising a compartment configured to house at least one light source configured to emit light in a main light emission direction. Furthermore, a lens movably arranged relative to the light source in direction of the main light emission direction is provided and an electric motor configured to move the lens relative to the light source in direction of the main light emission direction. The light fixture furthermore comprises a control unit configured to determine a current used by the electric motor to move the lens in the main light emission direction and the control unit is configured to detect a presence of liquid on the lens based on the determined current.

At least one technical advantage of the disclosed techniques relative to the art is that with the light fixture as discussed above or as discussed in further detail below it can be easily determined whether an unintended object such as liquid present on the lens has been part of the mass the motor is moving. When the electric motor moving the lens relative to the light source in direction of the main light emission direction pulls a larger current than expected, it can be deduced that liquid or any other object having a certain mass and weight is present on the lens. Instead of the presence of liquid any other object may be provided on the lens and this object or the liquid may deteriorate the light output in direction of the main light emission direction and may cause internal unwanted reflections.

BRIEF DESCRIPTION OF THE DRAWINGS

So that the manner in which the above recited features of the various embodiments can be understood in detail, a more particular description of the inventive concepts, briefly summarized above, may be given by reference to various embodiments, some of which are illustrated in the appended drawings. It should be understood that the appended drawings illustrate only typical embodiments of the inventive concepts and are therefore not to be considered limiting of scope in any way. The disclosure will be described in further detail below with reference to the accompanying drawings in which like reference numerals refer to like elements.

DETAILED DESCRIPTION

Figure 1:
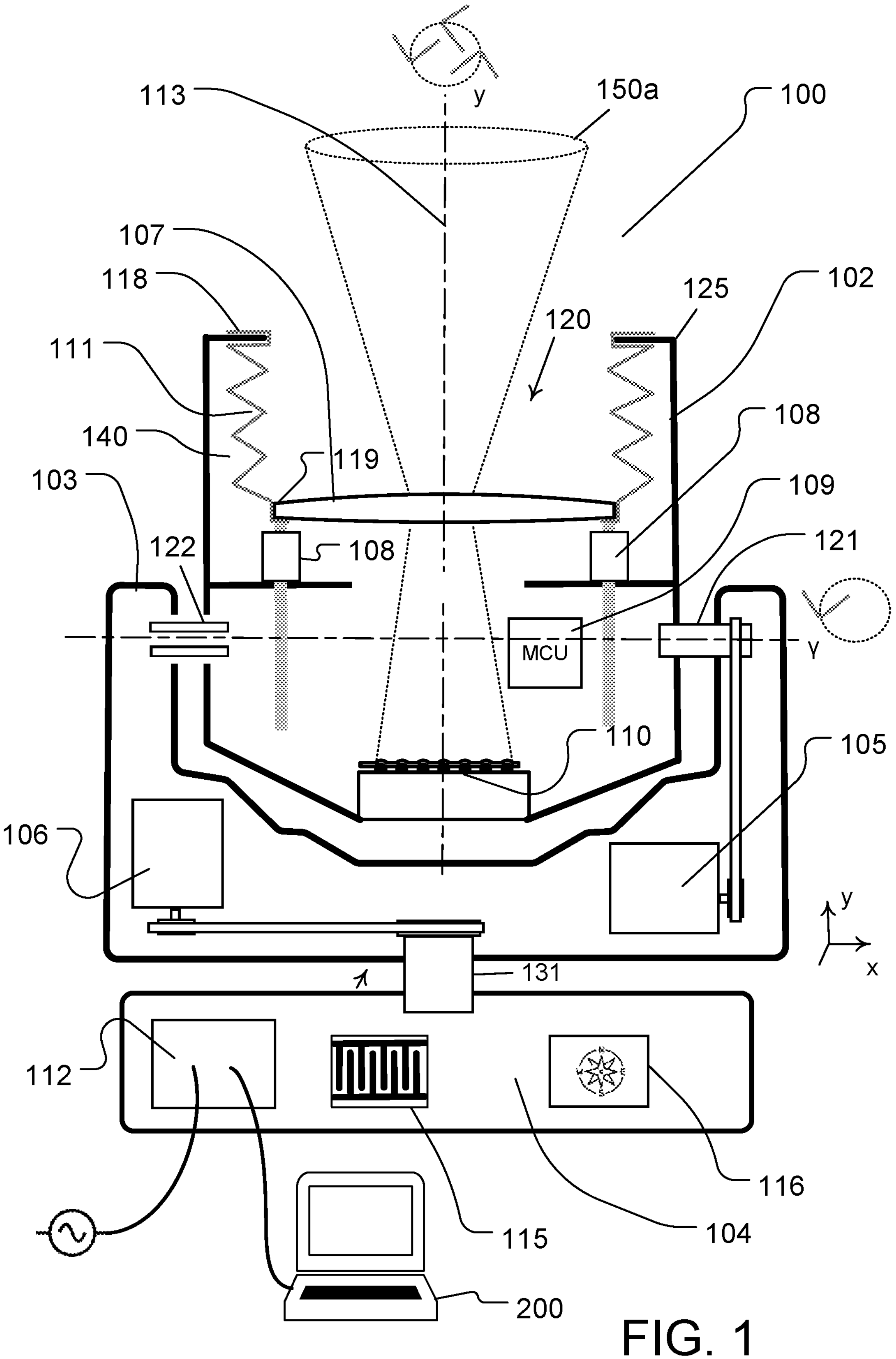
FIG. 1 illustrates a cross-sectional view through a light fixture configured to detect the presence of liquid on the lens with the lens being in a first position.

In the following, embodiments of the disclosure will be described in detail with reference to the accompanying drawings. It is to be understood that the following description of embodiments is not to be taken in a limiting sense. The scope of the disclosure is not intended to be limited by the embodiments described hereinafter or by the drawings, which are to be illustrative only.

The drawings are to be regarded as being schematic representations, and elements illustrated in the drawings are not necessarily shown to scale. Rather, the various elements are represented such that their function and general purpose becomes apparent to a person skilled in the art. Any connection or coupling between functional blocks, devices, components of physical or functional units shown in the drawings and described hereinafter may also be implemented by an indirect connection or coupling. A coupling between components may be established over a wired or wireless connection. Functional blocks may be implemented in hardware, software, firmware, or a combination thereof.

Figure 2:
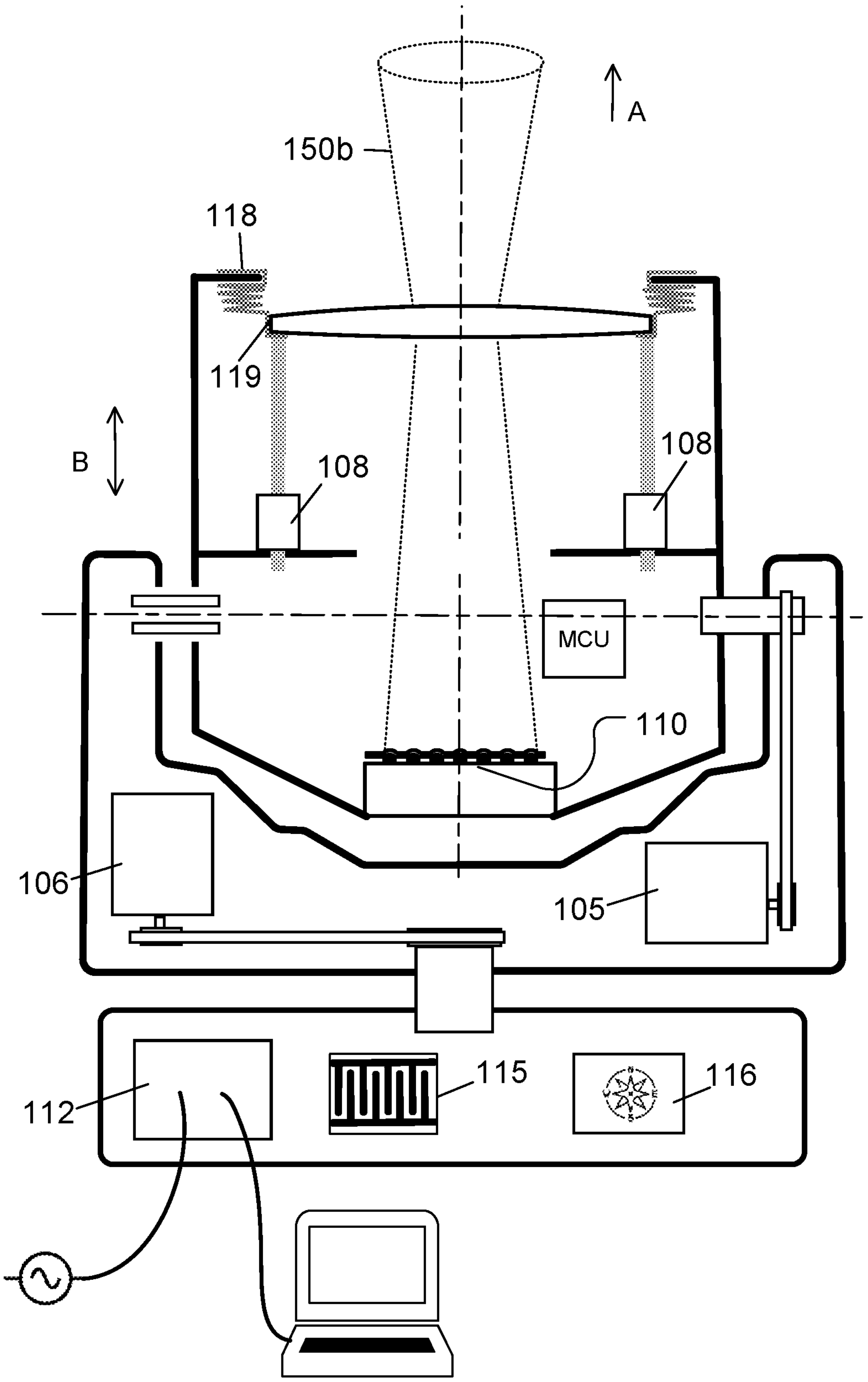
FIG. 2 shows a cross-sectional view through the light fixture in which the lens has been moved to a second, a more extended position.
Figure 3:
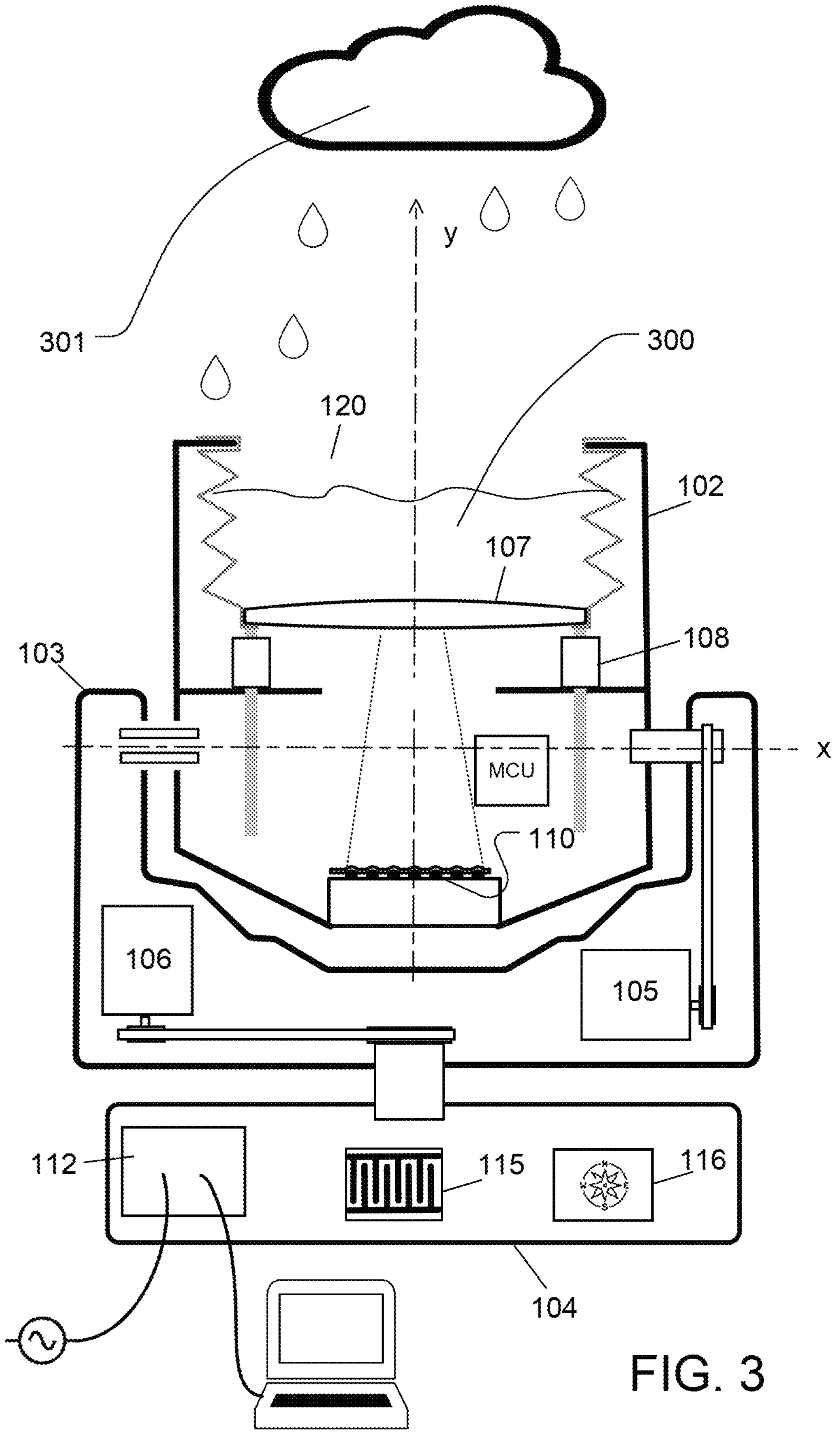
FIG. 3 shows a cross-sectional view through the light fixture with the lens being positioned such that liquid is present in front of the lens.

FIGS. 1 and 2 illustrate of a light fixture 100 in the form of a moving head light fixture, according to various embodiments. FIGS. 1 and 2 illustrate cross-sectional views. The light fixture 100 comprises, without limitation, a head 102, a yoke 103, and a base 104. Two first joints 121, 122 are arranged between the head 102 and the yoke 103, and a second joint 131 is arranged between the base 104 and the yoke 103 to provide the head 102 being rotatably connected to the yoke 103, and a yoke 103 being rotatably connected to the base 104. The light fixture, here the head 102, comprises a compartment 140 which houses one or a plurality of light sources 110 as shown in FIGS. 1 to 3. The at least one light source emits light along a main light emission direction shown in FIG. 2 with arrow A, wherein arrow A is parallel to middle axis 113 of the head.

FIGS. 1 and 2 illustrate cross-sectional views of the light fixture 100. A lens 107 is movably arranged relative to the light source 110. The lens 107 is arranged substantially perpendicular to the at least one light source 110, and movement of the lens 107 relative to the light source 110 is a substantially linear movement in a direction away from the at least one light source 110 or towards the at least one light source 110, as indicated by the arrow B. The lens can be a single lens, but it is also possible, that the lens 107 is a lens group. Accordingly, the lens is moved in direction of the main light emission direction and is located substantially perpendicular to the main light emission direction. The movement of the lens 107 adapts a shape of a light beam **150*a* and 150**B emitted by the light fixture in direction of the main light emission direction.

A deformable bellow or membrane 111 having a tubular shape extends from a first end 118 to a second end 119 and forms an inner cavity or recess 120 at a front end of the light fixture where the light beam exits the light fixture. The membrane 111 is at the first end 118 attached to the lens 107 and is at the second end 119 attached to an upper part of a sidewall 125 of the head 102. The sidewall 125 extends circumferentially around the lens 107, and the lens 107 moves relative to the sidewall 125. In FIG. 2 the deformable membrane 111 is in a compressed configuration, whereas in FIG. 1, the deformable membrane 111 is in an extended configuration.

Because the membrane 111 is attached to the lens 107 at the first end 118, the lens 107 closes the head 102 at the end at which the light exits the light fixture and allows unhindered passage for light beams from the at least one light source 110 in direction of the main light emission direction. In the situation shown in FIGS. 1 to 3, the main light emission direction is a vertical direction, but it is clear that the main light emission direction depends on the orientation of the head 102 relative to the yoke which can rotate around axis x, the tilt rotation, and the orientation of the yoke 103 relative to the base 104, the pan rotation.

When moving the lens 107 relative to the at least one light source 110, the membrane 111 is compressed and expanded with the movement of the lens 107 because the membrane 111 at the first end 118 is attached to the lens 107 and the membrane 111 at the second end 119 is attached to a sidewall 125 of the head. The lens 107 is moved back and forth in front of the light sources 110 by use of a plurality of motors 108, where only two motors are visible. In the illustrated embodiments, the motors 108 are linear motors in the form of spindle motors. It is also possible that other concepts such as a gear or belt drive on linear guides are used. The two visible motors 108 are oppositely arranged relative to a center axis Y extending through the center of the light source to facilitate linear movement of the lens 107.

By attaching the membrane 111 to the lens 107 at the first end 118, and to the sidewall 125 of at the second end, it is possible to seal an opening (not shown) along on outer periphery of the lens 107 to thereby avoid the ingress of dust, particles, moisture, or liquid and/or contaminants into the first compartment 140 along this periphery. It is consequently possible to avoid the use of an extra sealing window, which, in conventional light fixtures is typically arranged in front of the lens 107 at a distance thereto, such as close to the free end or recess of the sidewall 125.

Two motors 105, 106 are arranged for movement of the head 101. The motor 106 rotates the yoke relative to the base 104 and thus also rotates the head 102, and the motor 105 tilts the head 102.

An external computer 200 is in communication with a control unit 112 integrated in the base 104. The control unit 112 is arranged to control movement of the lens 107, to control the at least one light source 110, to control movement the head 102, to control movement of the yoke 103, and/or the like.

The base 104 can further comprises a user input element not shown by which a user of the light fixture can also control the light fixture. The user input element can comprises one or more buttons, one or more touch pads, a keyboard, and/or the like. Additionally, the base 104 can include a orientation sensor 116 which is able to determine an orientation of the base, the yoke and the head in space, especially relative to a vertical axis relative to the earth, which in the situation shown corresponds to the Y axis.

As discussed in connection with FIGS. 1 and 2, the lens 107 is the last element in the light path when the light generated by the light source 110 exits the light fixture 100 as the recess 120, corresponding to a cavity or bucket is not closed by a transparent window. No protective cover is provided at the height of the upper end of the sidewalls 125 so that in dependence on the position of the lens 107 a smaller or larger recess or cavity 120 is generated at the front end of the light source where the light exits the light fixture. As shown in connection with FIG. 3, it is possible that liquid 300 from rain 301 is collected in the recess 120 when the recess and the main light emission direction has a certain angle relative to vertical axis, axis Y in FIG. 3. Accordingly the tilt angle determines and influences whether and how much liquid 300 is collected in the recess 120 in case of rain. In order to determine the presence of liquid or any other object on the lens 107 it is possible to monitor the motors 108 during operation. As the weight of the lens 107 or any other component the motor has to move can be determined in advance, it is possible to determine a current needed by the motor(s) 108 to move the lens away from the light source 110. Accordingly, when the current pulled by the motors 108 is higher than expected, higher than a defined threshold value, it could be concluded that an unintended object has to be moved in addition to the lens 107. The control unit 112 or a control unit 109, which can be implemented as microcontroller, can monitor the motors in a closed loop circuitry during operation and when the current needed by the motor (s) 108 or the power consumed by the motor(s) 108 for moving the lens 107 away from the light source 110 is higher than a threshold, the control unit can conclude that liquid or any other object is present in the recess 120. It is clear that the liquid 300 as shown in FIG. 3 will negatively influence the emitted light beam and might deteriorate the components involved. Accordingly, the control unit may decide to evacuate the liquid from the recess 120 when its presence is detected. As shown in connection with FIG. 4 this may be possible by moving the light fixture in such a way that the liquid 300 can be removed by gravity by controlling the tilt angle of the head 102 and/or the pan angle in such a way that the liquid will move out of the recess 120.

An external computer or lighting console is in communication with control unit 112 and control unit either directly communicates with the motors 108 or via a control unit 112, which can be part of a driver circuit board. In general, the required calculations needed for determining the presence of liquid on the lens 107 can be made either by one of the control units 109, 112 or may be made partly by one of the control units 109, 112 and partly by the other of the control units 109, 112 based on the information from both control units 109, 112.

The control unit 109 or 112 can use different pieces of information to determine whether liquid or any other object is present on the lens 107. It is possible to use the current or power alone used by the motor 108 to move the lens 107. Furthermore, the control unit 109 or 112 may additionally use information from the orientation sensor 116 to determine whether an object is possibly present on the lens in view of the orientation of the recess relative to the vertical axis. This may especially depend on the tilt angle of the head 102. By way of example when the head is directed in the horizontal direction so that the main light emission direction is parallel to a horizontal plane (with reference to the earth) or in a situation where the main light emission direction is directed at an angle higher than 90 degrees relative to the vertical axis, it may be concluded that no liquid or object can present in the recess 120 as it may have fallen off anyway in view of the orientation of the head. Accordingly it is possible that the control unit 112 only detects the presence of liquid in the recess when tilt angle relative to the vertical axis is lower than a certain threshold angle such as 90 degrees as one possible threshold angle, however it should be understood that other threshold angles larger or smaller might be used, in dependence on the environment and weather conditions in which the light fixture is installed. The orientation sensor 116 may be placed in the head 102 or the base 104. If the orientation sensor is based in the head 102, information about pan or tilt values are not needed, however when the orientation sensor is placed in the base 104 as shown in the Figures, a correlation between orientation and pan and tilt values is needed to determine whether a part of the recess is positioned such that liquid may be collected in the recess.

The control unit 112 may furthermore use information from a liquid or rain sensor 115 present in the light fixture 100 which can actually detect the presence of liquid at the light fixture. The rain sensor alone may detect the presence of rain, but the rain may be present only on the sensor and not on the lens and the rain sensor alone can not easily determine an amount of liquid present on the lens 107. Furthermore the rain sensor could be placed anywhere on the light fixture where it is likely that rain is detected independent on the orientation of the light fixture. Accordingly, the rain sensor alone would have difficulties in detecting another information than just dry or wet and whether liquid is actually present on the lens 107. Accordingly, the control unit can base the decision whether liquid is present at the recess 120 only on the monitored current or power used by the motor 108, however it is also possible to additionally use further information including the information from the orientation sensor 116 and/or the rain sensor 115.

Figure 4:
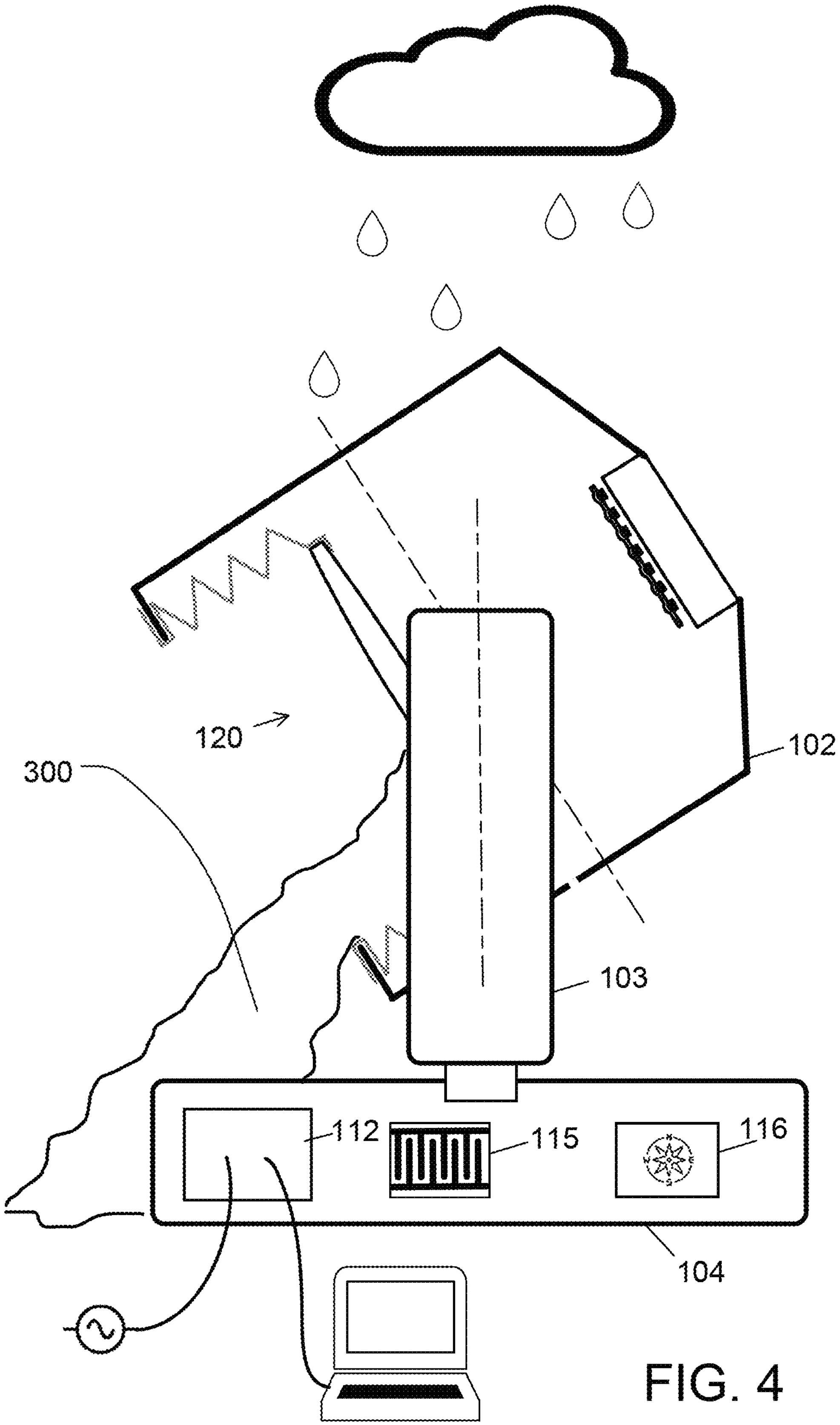
FIG. 4 shows a cross-sectional view of the light fixture of FIGS. 1-3 with a position allowing a liquid present on the lens to be removed.
Figure 5:
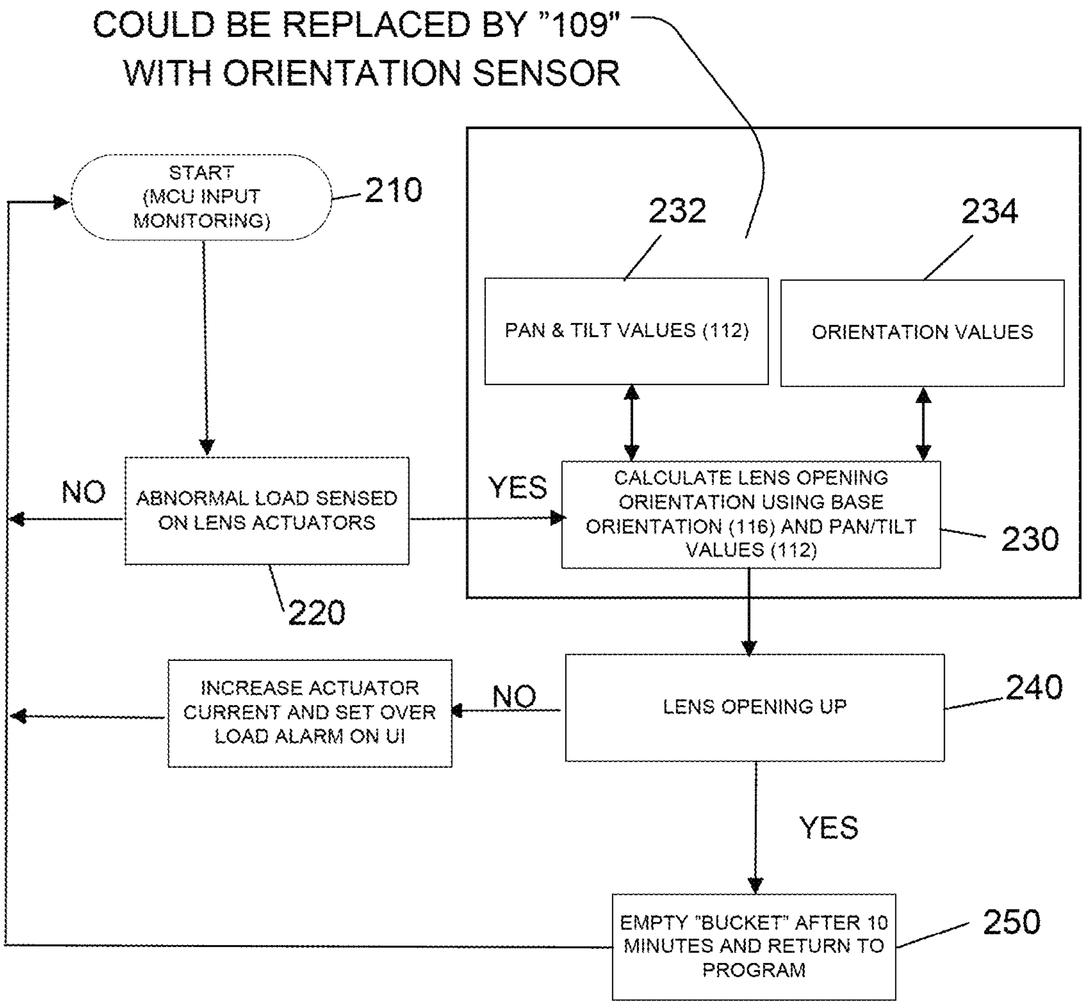
FIG. 5 shows an example representation of a flowchart how the light fixture determines that liquid may be present on the lens.

FIG. 5 shows a possible implementation of a state diagram or a method how the control unit 112 determines the presence of liquid on the lens 107. The method can start in a step or a state 210 where the control unit starts monitoring the presence of a liquid. In step 220 the load of the motors 108 is monitored and it is determined whether the load is within a predefined load range or whether the load is higher than expected, i.e. higher then a threshold. If this is not the case the system returns to step 210 and continues monitoring. If however an abnormal load is determined in step 220 it is possible to determine a location of the lens and an orientation of the light fixture and the moving head as such (step 230). For this determination in step 230 it is possible to use the determined pan and tilt values of the moving head light fixture in step 232, especially when an orientation sensor is placed in the base 104. Furthermore it is possible to determine the orientation of the base 104 in step 234 relative to the earth, how the light fixture 100 is installed, whether the base is arranged horizontally or vertically and facing in an upward or downward direction. Based on the orientation, whether the base is aligned horizontally or vertically or at any other angle relative to the horizontal axis and based on the pan and tilt values, it can be determined precisely whether the recess 120 is facing at least partly a direction from where rain or liquid is expected to be collected in the recess so that it stays in the recess 120. If it is determined in step 230 that the opening angle for the recess is facing at least partly upwards as determined in step 240, a mechanism can be initiated in step 250, by which the liquid is removed from the recess by gravity as shown in FIG. 4 by arranging the head in such a way that it faces in a downward direction towards the earth (step 250). The removing step can be either initiated directly after the determination or after a certain period of time has lapsed after determination. After the step of removing the liquid is completed, the control unit can go back to the start 210 with the monitoring and the light fixture can return to a position it had before the removal process for the water was initiated. If it is determined in step 240 that the recess is already facing in a direction where no liquid can be present in the recess due to the present gravitational forces, the control unit can nevertheless in step 260 increase the activated current and may set an alarm in order to inform a user of the light fixture 100 that any other error may have occurred.

From the above said some general conclusions can be drawn as discussed in more detail below. The control unit 112 may detect the presence of liquid on the lens 107 when the current needed by the motor is higher than a defined threshold value.

The light fixture can comprise a movable head in which the lens, the light source and the electric motor is located and the control unit can be configured, when the presence of the liquid is detected, to initiate a movement of the head in such a way that the liquid is removed from the lens by gravity. As discussed in connection with FIG. 4, this might be possible by setting the head to a defined tilt angle and or pan angle which allows the evacuation of the recess simply with gravitational forces.

The lens 107 can be an outer lens having a lower surface facing the compartment with the light source and an upper surface facing a space outside the light fixture, wherein the control unit is configured to detect the presence of the liquid on the upper surface. Accordingly, the lens is the outermost component of the light fixture the light will pass when following the main light emission direction.

The light fixture may furthermore comprise an orientation sensor such as sensor 116 configured to determine a vertical angle of the main light emission direction in space relative to a vertical direction on the earth, wherein the control unit can be configured to take into account the determined vertical angle to detect the presence of liquid on the lens. As discussed above, this can mean that only when the vertical angle is within a defined range, such as +/−90 degrees, liquid can be possibly accumulated in the recess and only if this accumulation is possible theoretically, countermeasures might be taken by the control unit to evacuate the liquid by moving the head into the right position. Accordingly the control unit may only detect the presence of the liquid on the lens when the determined vertical angle is smaller than a threshold angle.

Furthermore it is possible that a rain sensor such as sensor 115 is present which is configured to determine a presence of rain at the light fixture, i.e. that the light fixture is exposed to rain. The control unit can then be configured to take into account the information of the rain sensor to determine the presence of liquid on the lens. The rain sensor alone may not provide a very reliable result whether and how much liquid is present on the lens, but the combined information using the current of the motor 108 and the information from the rain sensor 115 will increase the precision of the determination that liquid is present on the lens 107 and the number of false positive determinations will be reduced.

The light fixture can be a moving head light fixture comprising a base, a yoke and a head, wherein the yoke is rotatably arranged relative to the base and the head is rotatably arranged relative to the yoke and the compartment with the light source and the lens is arranged in the head. It is also possible that only the head is rotatably arranged relative to the yoke or may be directly coupled to a base.

The lens can be arranged substantially perpendicular to the main light emission direction and the electric motor can be configured to move the lens in a direction away from the at least one light source or towards the at least one light source.

The light fixture can furthermore include a deformable membrane 111 having a tubular shape extending from a first end to a second end and forming a recess such as recess 120 open to an exterior space outside the light fixture, wherein the first end of the membrane is attached to the lens and the second end of the membrane is attached to a side wall of the compartment, and the sidewall can extend circumferentially around the lens. The control unit is then configured to determine the presence of the liquid in the recess.

The lens may be an outermost component of the light fixture through which the light emitted by the light source into the main light emission direction passes. This means that no other component or cover is present which could prevent the presence of liquid in the recess 120. The size of the recess depends on the position of the lens 107 relative to the light source 110 and the closer the lens is located to the light source 110 the larger the recess will be. The control unit can detect the presence of the liquid on the lens based on the current drawn by the electric motor or based on the power used by the electric motor to move the lens.

The electric motor can be a stepper motor.

As discussed above the present application provides an easy and reliable method for the detection of liquid without the need of further components as the current or power used by the electric motor can be used to determine the presence of liquid. The present techniques will also increase the expected lifetime of the light fixture as any gaskets or ceilings will be less stressed by high water pressure which could be present if the liquid is not removed. Furthermore the presence of liquid over a longer period of time could lead to a water ingress and as such to a failure of the product.

The measurement of the current or power at the motors do not mean a high effort, especially compared to a solution where rain sensors are placed at the head section. The motor control also allows a lower current in normal operation and when a higher current is measured, a higher current might be applied. Accordingly a load buffer is not necessary and abnormalities in operation can be detected as discussed above to prevent further damages. A load sensing of a stepper motor is possible and may be implemented by a closed loop back EMF (electromotive force).

What is claimed is:

1. A light fixture comprising:

a compartment;

at least one light source housed in the compartment and configured to emit light in a main light emission direction;

a lens movably arranged relative to the at least one light source in the direction of the main light emission direction;

an electric motor configured to move the lens relative to the at least one light source in the direction of the main light emission direction; and a control unit configured to determine a current used by the electric motor to move the lens in the main light emission direction, wherein the control unit is configured to detect a presence of a liquid on the lens based on the determined current.

2. The light fixture of claim 1, wherein the control unit is configured to detect the presence of liquid on the lens when the current is higher than a defined threshold current.

3. The light fixture of claim 1, wherein the light fixture comprises a movable head in which the lens, the at least one light source, and the electric motor are located, wherein the control unit is configured, when the presence of liquid is detected, to initiate a movement of the movable head to remove the liquid from the lens by gravity.

4. The light fixture of claim 1, wherein the lens is an outer lens with a lower surface facing the compartment and an upper surface facing a space outside the light fixture, wherein the control unit is configured to detect a presence of the liquid on the upper surface.

5. The light fixture of claim 1, further comprising a rain sensor configured to determine that the light fixture is exposed to rain, wherein the control unit is configured to take into account exposure to rain as determined by the rain sensor to determine the presence of liquid on the lens.

6. The light fixture of claim 1, wherein the light fixture is a moving head light fixture comprising a base, a yoke, and a head, wherein the yoke is rotatably arranged relative to the base and the head is rotatably arranged relative to the yoke, wherein the compartment with the at least one light source and the lens is arranged in the head.

7. The light fixture of claim 1, wherein the lens is arranged substantially perpendicular to the main light emission direction and the electric motor is configured to move the lens in a direction away from the at least one light source or towards the at least one light source.

8. The light fixture of claim 1, further comprising a deformable membrane having a tubular shape extending from a first end to a second end and forming a recess open to an exterior space outside the light fixture, wherein the first end of the deformable membrane is attached to the lens, the second end of the deformable membrane is attached to a sidewall of the compartment, and the sidewall extends circumferentially around the lens, wherein the control unit is configured to determine the presence of liquid in the recess.

9. The light fixture of claim 1, wherein the lens is an outermost component of the light fixture through which the light emitted by the at least one light source in the main light emission direction passes.

10. The light fixture of claim 1, wherein the control unit is configured to detect the presence of the liquid on the lens based on power used by the electric motor to move the lens.

11. The light fixture of claim 1, wherein the electric motor is a stepper motor.

12. The light fixture of claim 1, further comprising an orientation sensor configured to determine a vertical angle of the main light emission direction in space relative to an earth vertical direction, wherein the control unit is configured to take into account the determined vertical angle to detect the presence of the liquid on the lens.

13. The light fixture of claim 12, wherein the control unit only detects the presence of the liquid on the lens, when the determined vertical angle is smaller than a threshold angle.

* * * * *